(12) United States Patent
Ebefors et al.

(10) Patent No.: US 8,592,981 B2
(45) Date of Patent: Nov. 26, 2013

(54) VIA STRUCTURE AND METHOD THEREOF

(75) Inventors: Thorbjörn Ebefors, Huddinge (SE);
Edvard Kälvesten, Hägersten (SE);
Peter Ågren, Huddinge (SE); Niklas Svedin, Stockholm (SE)

(73) Assignee: Silex Microsystems AB, Jarfalla (SE)

( * ) Notice: Subject to any disclaimer, the term of this patent is extended or adjusted under 35 U.S.C. 154(b) by 1 day.

(21) Appl. No.: 13/141,609

(22) PCT Filed: Dec. 23, 2009

(86) PCT No.: PCT/SE2009/051496
§ 371 (c)(1),
(2), (4) Date: Oct. 3, 2011

(87) PCT Pub. No.: WO2010/074649
PCT Pub. Date: Jul. 1, 2010

(65) Prior Publication Data
US 2012/0018898 A1 Jan. 26, 2012

(30) Foreign Application Priority Data

Dec. 23, 2008 (SE) ...................................... 0802663

(51) Int. Cl.
*H01L 29/40* (2006.01)
(52) U.S. Cl.
USPC .... 257/758; 257/621; 257/774; 257/E23.011; 257/E23.067; 257/E21.577; 257/E21.597
(58) Field of Classification Search
USPC .................. 257/773, 774, E23.067, E21.597, 257/E21.567, 750, 758, 621, E23.011, 257/E21.577
See application file for complete search history.

(56) References Cited

U.S. PATENT DOCUMENTS 5,535,626 A * 7/1996 Bullis et al. ................ 73/514.32
6,716,657 B1 4/2004 Soh
(Continued)

FOREIGN PATENT DOCUMENTS

DE 10205026 C1 5/2003
EP 1197779 A2 4/2002
(Continued)

OTHER PUBLICATIONS

European Search Report issued May 25, 2012 for European Patent Application No. 09835356.8 (11 pages).
(Continued)

*Primary Examiner* — Jasmine Clark
(74) *Attorney, Agent, or Firm* — Pierce Atwood LLP; Kevin M. Farrell; Weber Hsiao

(57) ABSTRACT

The invention relates to a layered micro-electronic and/or micro-mechanic structure, comprising at least three alternating electrically conductive layers with insulating layers between the conductive layers. There is also provided a via in a first outer layer, said via comprising an insulated conductive connection made of wafer native material through the layer, an electrically conductive plug extending through the other layers and into said via in the first outer layer in order to provide conductivity through the layers, and an insulating enclosure surrounding said conductive plug in at least one selected layer of said other layers for insulating said plug from the material in said selected layer. It also relates to micro-electronic and/or micro-mechanic device comprising a movable member provided above a cavity such that it is movable in at least one direction. The device has a layered structure according to the invention. Methods of making such a layered MEMS structure is also provided.

7 Claims, 14 Drawing Sheets

(56) References Cited

U.S. PATENT DOCUMENTS

| | | |
|---|---|---|
| 7,928,579 B2 * | 4/2011 | Wark et al. .................... 257/774 |
| 2004/0009624 A1 | 1/2004 | Gormley et al. |
| 2004/0245645 A1 | 12/2004 | Miyamoto et al. |
| 2005/0037531 A1 * | 2/2005 | Kouma et al. .................... 438/48 |
| 2005/0059217 A1 | 3/2005 | Morrow et al. |
| 2006/0066964 A1 | 3/2006 | Greywall |
| 2007/0020926 A1 | 1/2007 | Kalvesten et al. |
| 2007/0091414 A1 | 4/2007 | Yang |
| 2007/0145591 A1 | 6/2007 | Yano et al. |
| 2008/0006850 A1 | 1/2008 | Ribnicek et al. |
| 2008/0012147 A1 | 1/2008 | Watanabe |

FOREIGN PATENT DOCUMENTS

| | | |
|---|---|---|
| GB | 2375185 A | 6/2002 |
| WO | 2006123298 A2 | 11/2006 |
| WO | 2007023947 A1 | 3/2007 |
| WO | 2007089206 A1 | 8/2007 |
| WO | 2007110799 A2 | 10/2007 |

OTHER PUBLICATIONS

International Search Report for International Patent Application No. PCT/SE2009/051496 issued Apr. 12, 2010 (4 pages).

* cited by examiner

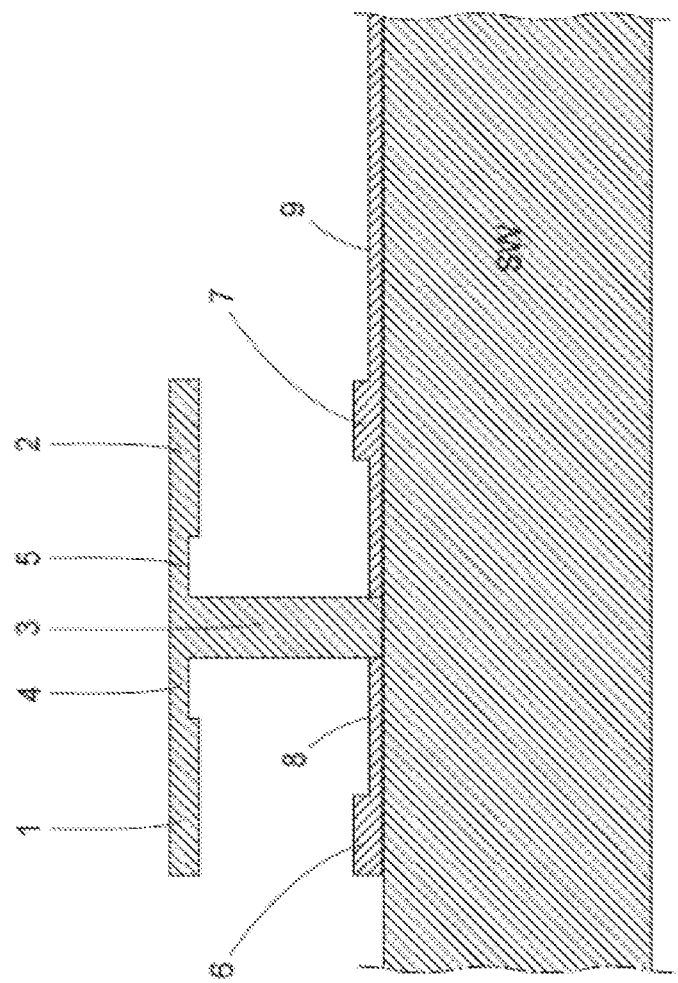

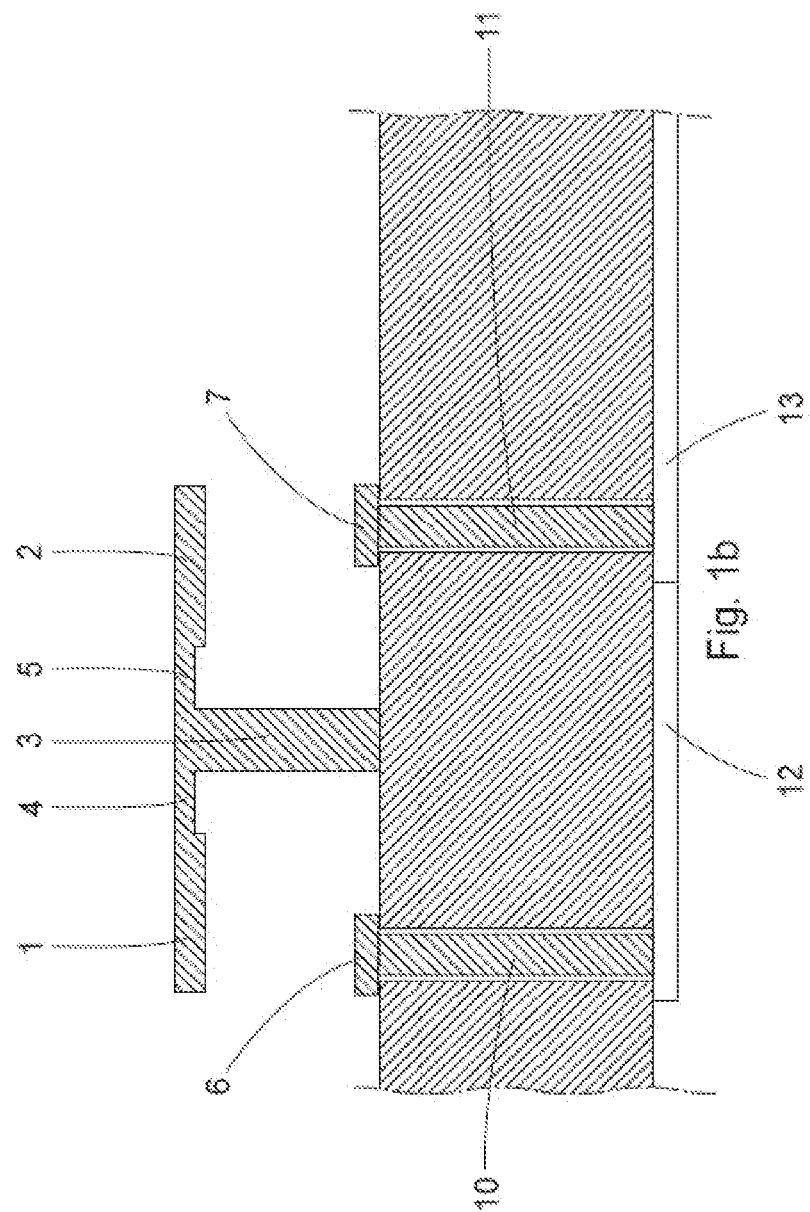

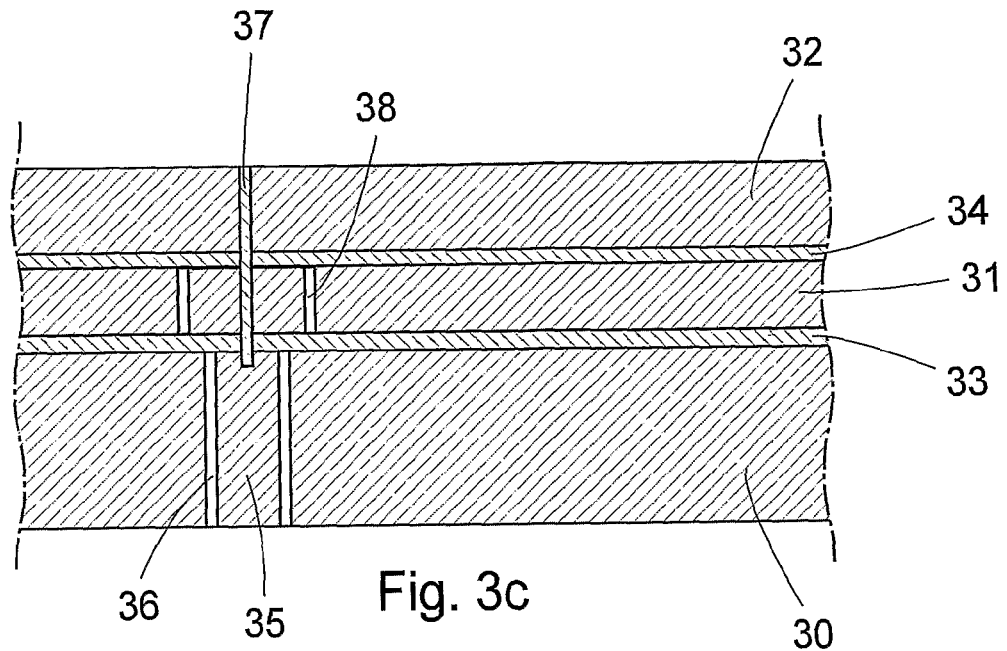
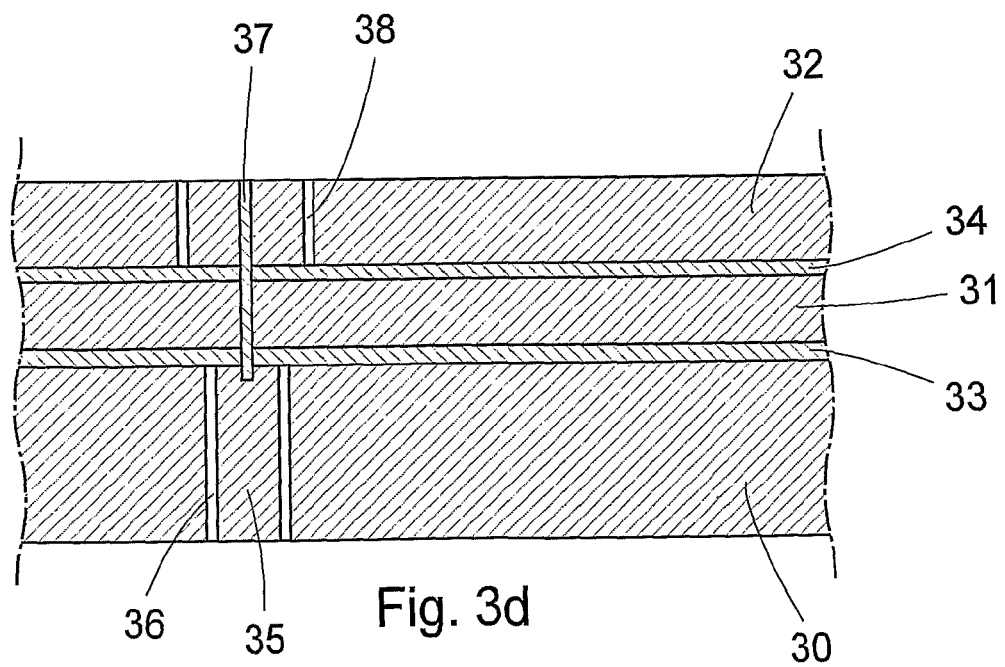

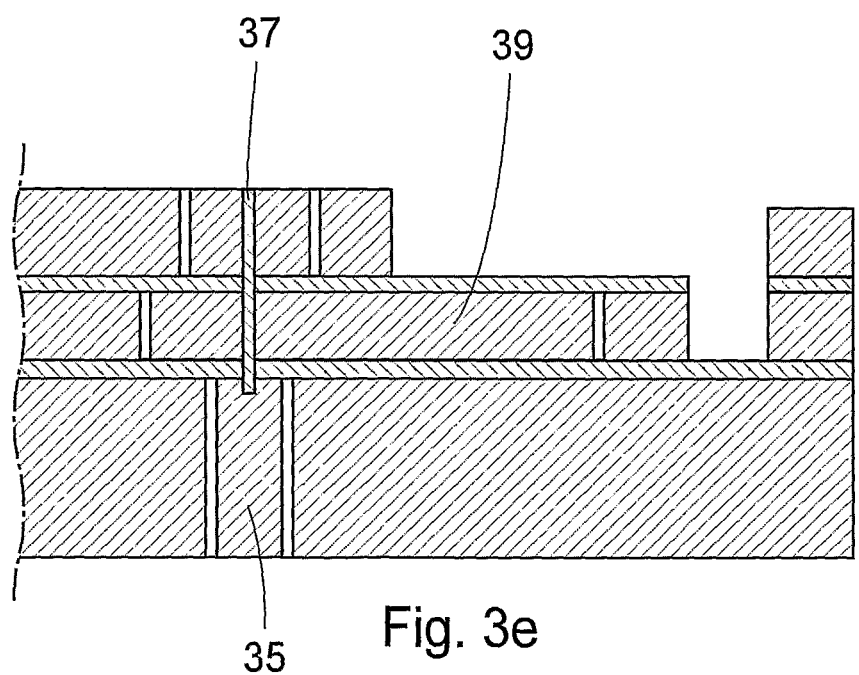

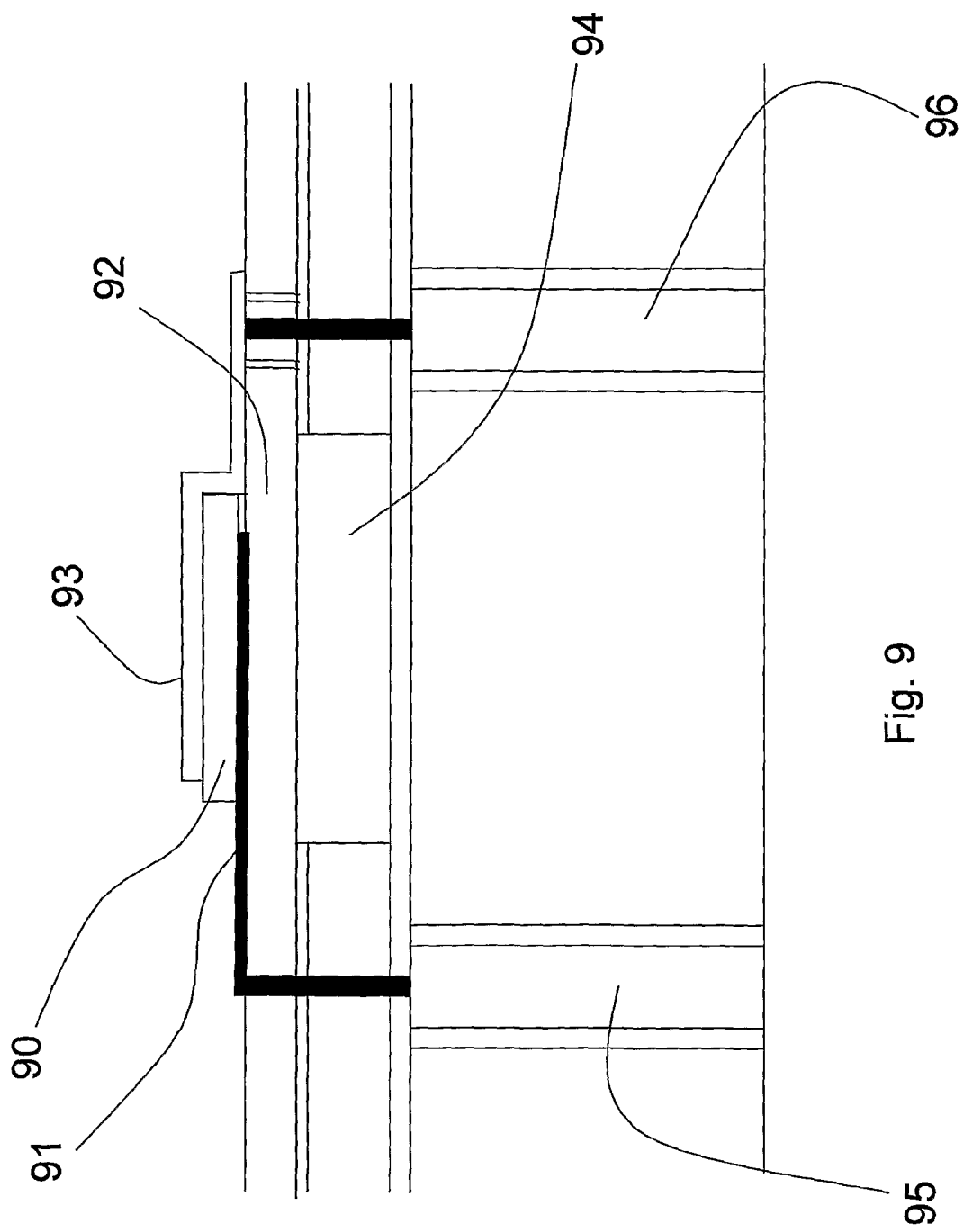

VIA STRUCTURE AND METHOD THEREOF

The inventions disclosed herein relate generally to processes for the manufacture micro-mechanic devices comprising movable elements that can be actuated electrically and/or electrostatically by means of electrodes. Examples of such devices are micro mirrors and large arrays of micro mirrors, micro-switches, oscillators, loud-speaker membranes. In particular the inventions relate to aspects of the processes that enable closer spacing of mirrors and that provides structures that eliminate disturbances in the actuation of the mirrors in operation. Other applications are energy generating system, e.g. so called energy harvesting using piezo materials for transforming kinetic energy to electric energy.

BACKGROUND OF THE INVENTION

The prior art devices and processes comprise lateral routing (surface routing) of electrical leads to and from the actuating structures (electrodes). It is difficult to space such surface routed electrical leads closely enough. Actuation of deflectable elements such as mirror arrays at several positions requires often that the electrical leads are routed beneath adjacent mirrors, which inevitably may cause disturbance and interferes with mirrors in the arrays that it is not desired to actuate.

Furthermore, wire-bonding is often required on the same side of the wafer where the deflectable elements such as mirrors and arrays of mirrors are provided, which also requires space, and prevents further reduction of dimensions and/or prevents closer spacing of mirrors in the arrays.

US 2004/0009624 A1 (Gormley et al) discloses a micro-mechanic device having mirror arrays that are actuated by electrodes coupled through a substrate by wafer through connections (vias). However, routings of non-wafer native material are made on the surface of the substrate, on the opposite side of where the mirrors are provided.

In SE-526366 (Silex Microsystems) there is disclosed use of wafer-through vias for actuating mirrors.

SUMMARY OF THE INVENTION

In accordance with the present invention vias are provided through the wafers so as to enable the provision of electrodes at desired locations for actuation purposes. Thus, it enables positioning of actuation electrodes underneath mirrors without causing disturbance to other mirrors in the array. Routing of leads with deposited materials is then made possible on the backside of the wafer. Routing of leads is provided within the wafer native material in the wafer structure, by providing insulated regions within the layers.

Thus, there is provided a layered micro-electronic and/or micro-mechanic structure, comprising at least three alternating electrically conductive layers with insulating layers between the conductive layers, and further comprising a via in a first outer layer, said via comprising an insulated conductive connection made of wafer native material through the layer; an electrically conductive plug extending through the other layers and into said via in the first outer layer in order to provide conductivity through the layers; and an insulating enclosure surrounding said conductive plug in at least one selected layer of said other layers for insulating said plug from the material in said selected layer.

Furthermore, according to the invention, these actuation and routing principles are used for making micro-mechanic devices having movable elements that can be caused to deflect from a nominal or rest position to position in which part of or the entire element is spatially displaced. Such elements can be embodied as e.g. mirrors attached at one end to the substrate by means of a "hinge structure" to render them deflectable, or mirrors attached to the substrate in several, preferably four points, so as to be translatable rather than deflected. This entails moving the entire mirror plane in a parallel movement. Other elements are loudspeaker membranes, which are rigidly attached along the periphery to the substrate, and can be caused to vibrate. Also, oscillators for clocking purposes, e.g. crystals, are examples of embodiments of the invention.

Also provided is a micro-electronic and/or micro-mechanic device comprising a substrate having a cavity formed therein and at least one movable member provided above the cavity such that it is movable in at least one direction, the device further comprising at least one electrostatic actuation electrode for each movable member for causing movement of said member(s), wherein the electrodes are coupled to via structures extending through the substrate, whereby the coupling between electrodes and via structures is provided by means of a layered micro-electronic and/or micro-mechanic structure according to the invention.

Also, if a piezo material is applied on the movable element it will be possible to pick up energy from external mechanical motion. Thereby, two laterally routed electrode layers insulated from each other and connected to wafer through connections are provided on each side of the element made of the piezo material.

Preferably, an insulating enclosure has a geometry such that the enclosure extends laterally within the layer, thereby forming a routing structure for routing signals laterally within the layer.

Suitably, said plug is uninsulated from surrounding material in at least one of the other layers.

In one embodiment there are three conductive layers and the insulating enclosure is provided in one of the layers.

In other embodiments there are four conductive layers and the insulating enclosure is provided in two of the layers.

BRIEF DESCRIPTION OF THE DRAWINGS

The invention will now be describe in more detail with reference to the drawings which disclose non-limiting examples, and in which FIG. 1a shows schematically a device having a deflectable mirror according to prior art;

FIG. 1b is another example of a prior art mirror device;

FIGS. 3a-e illustrate embodiments of routing in layers;

FIG. 9 shows an embodiment with a movable element made form a piezo material.

DETAILED DESCRIPTION OF EMBODIMENTS OF THE INVENTION

Figure 1C:
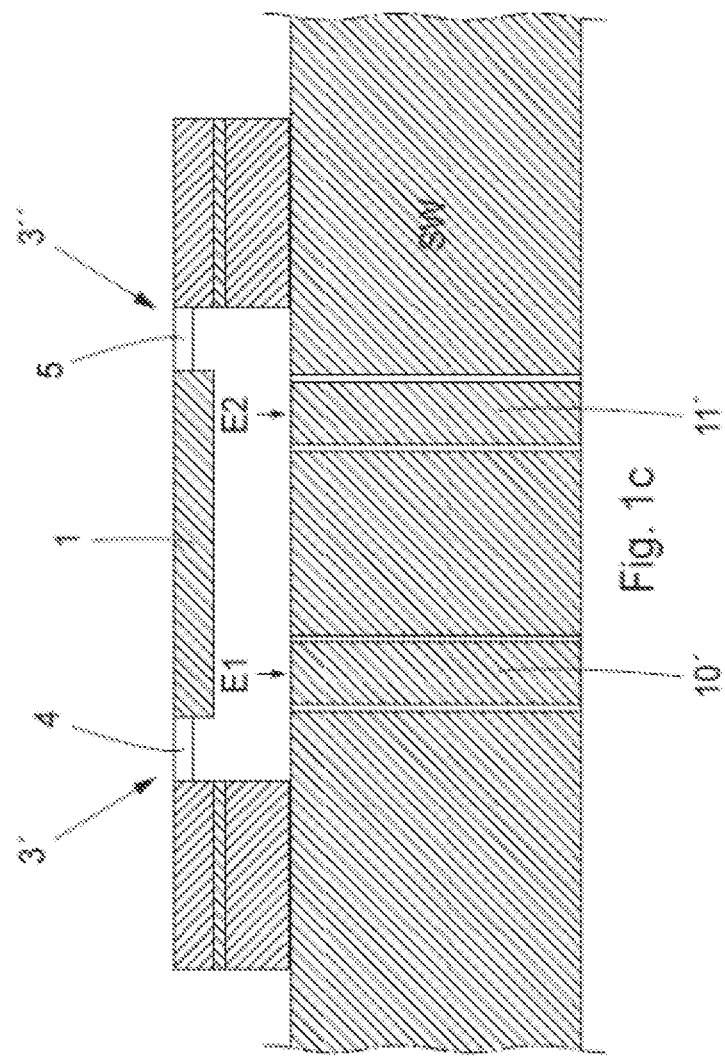
FIG. 1c is a still further example of a prior art device.

Herein the term "via" is used for any structure that extends through a wafer and is capable of transmitting electrical signals (the y can also be referred to as "wafer through connections"). These "vias" are made of wafer native material, i.e. from the wafer it self of which they form a part. The vias can have different cross sections, i.e circular, rectangular, square or irregular, although in most cases circular cross sections are preferred.

The term "via structure" is taken to mean both a single piece of material extending into and/or through a wafer, and a combination of details forming a more complex wafer through connection or a connection extending at least partly through a wafer and/or through only one or a few of several layers in a wafer structure.

A "wafer structure" is taken to mean several wafers bonded together, or an SOI wafer having a handle layer, a buried oxide layer and a device layer, and any combination of wafers of various types forming at least one layer separated from another, e.g. by an oxide layer.

For the purpose of this application "energized electrode" shall be taken to mean an electrode to which a voltage has been applied versus ground (GND) for actuation of a movable element located near the electrode. In such an energized state the electrode becomes charged, but practically no current flows between the electrode and the element to be actuated, which will only be moved in the electric field generated.

Routing by Vias

A number of embodiments of the invention will now be described by reference to the drawing figures.

However, first some prior art structures will be discussed.

Thus, in FIG. 1a there is schematically shown (not to scale) a prior art device, namely one mirror structure of a mirror array, having routing members.

The mirrors 1 and 2 are attached to a supporting post 3 via hinge structures 4 and 5, respectively, made by MEMS techniques in a substrate wafer SW. Beneath each mirror there is provided actuation electrodes 6, 7 that will cause the mirrors 1, 2 to deflect when the electrodes 6, 7 are energized, i.e. charging the electrodes by applying a high voltage. The hinges 4,5 are torsion bars, i.e. in the shown device the mirrors will tilt around an axis extending in the plane of the paper along the hinges. Thus, there is provided two electrodes on each side of the post 3, i.e. one electrode in each pair is hidden by the one shown.

In this prior art device the electrodes are routed "away" from the array by electrical leads 8, 9 provided on the substrate surface. As can be understood, the lead 8 from electrode 6 for the actuation of mirror 1 will have to pass beneath mirror 2, and when energized it will affect also mirror 2 to some extent causing functional artefacts.

Another prior art device, shown in FIG. 1b, employs vias 10, 11 through the wafer SW for energizing the electrodes connecting the electrodes 6, 7 to routing leads 12, 13 on the back side of the wafer SW. The vias 10, 11 are made of non-wafer native material, i.e. a hole has been made in the substrate and then filled with metal or some other conductive material, such as aluminium or highly dope semiconductor. Routing leads 12, 13 are of course provided adjacent each other, suitably in parallel to the periphery of the wafer where wire bonding can be provided, if desired. Alternatively there could be provided a double layer of metal on the back side with an insulating layer between the conductive layers. In this way one could provide crossing conductors thereby increasing the flexibility in the routing structures. By plating (or any other suitable method known by the skilled man) contact bumps can be provided. Preferably so called Under Bump Metallization (UBM), which enables flip-chip mounting of the mirror component. Control circuits, e.g. ASICs, can thereby be mounted directly on the back side of the mirror component. For large mirror arrays, e.g. >12×12, such a solution is much more cost effective than conventional wire bonding according to the prior art. Flip-chip mounting is not possible without the via technology.

In FIG. 1c there is shown a further prior art device wherein a movable element such as a mirror 1 is attached to a substrate at 3' and 3" by means of hinges 4,5 similar to the devices of FIGS. 1a-b. Actuation is achieved by vias 10', 11' of wafer native material extending through the substrate wafer SW. The exposed surfaces E1, E2 of the vias 10', 11' form the electrodes.

The mirror is one representative example of a movable element, i.e. an element that can be caused to be at least partially displaced or deflected from a nominal rest position. Other examples (to be describe later) are oscillators, vibrating membranes, optical switches etc.

Electrical Connection into Desired Layers of a Structure Comprising Alternating Insulating and Conductive Layers The invention relates to MEMS devices in which it is desired to provide electrical potentials including ground potential to actuation electrodes at desired locations in a layered structure.

Figure 3A:
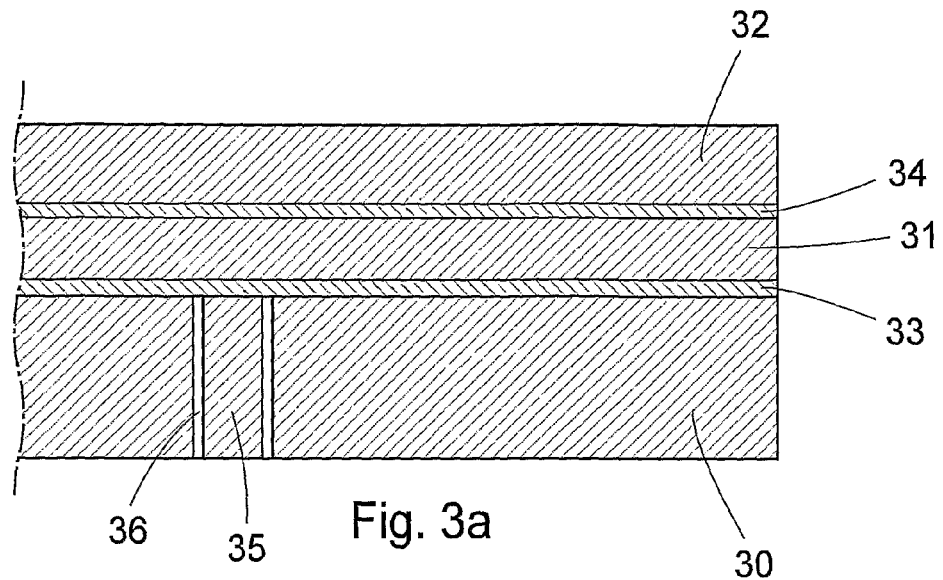

Referring to FIG. 3a there is shown schematically a layered structure comprising three (first, second and third, respectively) layers 30, 31 and 32 of e.g. silicon or other semiconducting or conducting material, and interposed between these layers a first insulating layer 33 and a second insulating layer 34. This layered structure is suitably made from two SOI wafers that have been bonded together, whereby the first conductive layer 30 constitutes the handle layer and the second conductive layer 31 constitutes the device layer of a first SOI wafer.

The third conductive layer constitutes the device layer of a second SOI wafer. Thus, as can be understood, the structure shown in FIG. 3a has been achieved by bonding the two SOI wafers and removing the handle layer of the second SOI wafer.

Alternatively, instead of using a second SOI wafer, it is equally possible to bond a second ordinary wafer to provide the third layer. In this case the bonded wafer is grinded or polished to the desired thickness of layer 32. This process is sometimes referred to as a D-SOI process.

There is also provided a wafer native via structure 35, 36 extending through the first conducting layer 30. The via structure can comprise a wafer native via 35 of heavily doped Si surrounded by an insulating enclosure 36 so as to provide electrical insulation from the surrounding conductive first layer 30. The wafer native via can be the native wafer material suitably doped Methods for making the vias are per se not part of the present invention and will not be discussed herein. Se e.g. the above mentioned SE-526366.

For MEMS applications in which this kind of layered structures is commonly used, it is often desired to apply electric potential to selected layers, and sometimes at selected points or areas (i.e. actuation electrodes) in such layers.

According to the invention there is provided a versatile method for tayloring such application of electric potential to the needs at hand.

Thus, the invention provides a method for making electrical connection into desired layers of a layered wafer native structure and at the same time preventing electric coupling into adjacent layers. Using wafer native material has several advantages, as discussed further below.

Figure 3B:
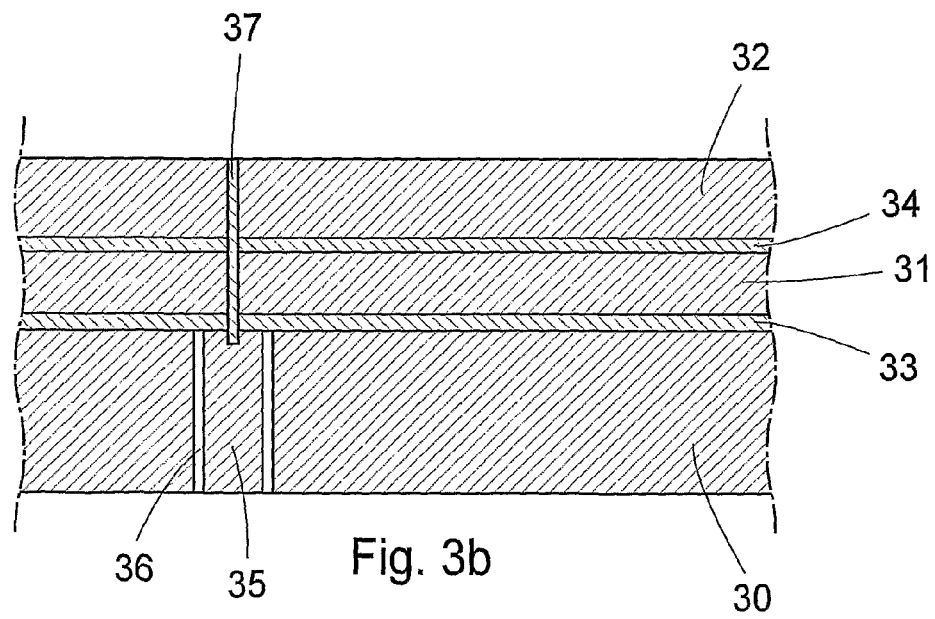

Referring now to FIG. 3b, a layered wafer native structure as shown in FIG. 3a is used, and in a first step a hole 37 is etched through the third and second conductive layers 32 and 31 and thus also through the insulating layer 34 as well as through insulating layer 33 and a short distance into the via 35. The hole 37 is filled with doped poly-silicon, metal or silicide to provide conductivity. The invention does not limit the material choice to poly silicon although it is preferred. Any metal, silicide or any conductive material could be used. Poly-silicon is preferred because it has very similar thermal expansion properties to silicon. Too large differences in expansion properties could lead to mechanical tension that might "buckle" the mirror. The thermal budget for later steps in the process is also affected by most metals. As shown in FIG. 3b if a potential is applied to the via 35 this potential will be transferred into both the second 31 and the third 32 layer.

However, in a first embodiment of the invention, illustrated in FIG. 3c, electrical potential is provided through the via 35 and into the third conductive layer 32 only. In order to achieve this the first SOI wafer has to be processed before it is bonded to the second SOI wafer. Namely there must be provided an insulating enclosure 38 surrounding the portion of the wafer where the poly silicon plug will extend through the second layer 31 of the layered structure.

This is achieved by etching a trench 38 in a closed loop into the device layer of the first SOI wafer down to the buried oxide layer, and optionally filling the trench partially or completely with oxide. On the other hand the trenches could be left as they are i.e. filled with air, if they are wide enough so that no electrical breakdown, i.e. electrical current must not be able to pass the trench, can occur. When the two SOI wafers have been bonded together and the handle layer of the second SOI wafer has been removed the procedure discussed with reference to FIG. 3b is performed, i.e. a poly silicon plug 37 is provided through the layered structure, and the result shown in FIG. 3c will be obtained. If an electric potential is applied to the via in this structure, the potential will be transferred to the third layer 32 without affecting the second layer.

In a further embodiment, if it is desired to provide a potential selectively to the second layer 31, again a trench 38 is made by etching, but in this case it will be made after the SOI wafers have been bonded together and the handle layer removed from the second SOI wafer. Thus, the trench 38 is made in the third layer 32, and again, like in the embodiment of FIG. 3c, at least partially filled with insulating material. Also in this case it may be possible to leave the trenches unfilled. Then a hole 37 is etched through the layered structure, as disclosed with reference to FIG. 3b, and the resulting structure is shown in FIG. 3d. Here, an applied potential will be transferred into the second layer 31 only, and leave the third layer unaffected.

In the shown embodiments the applied potential has been shown to be transferred into entire layers. However, the principle can also be used for routing signals or electric potential locally within layers. If for example the applied potential is to be used for actuating purposes at one specific location within a layer, there could be provided insulating trenches forming routing "channels" within the layer in question, such that the via can be located at any desired point on the wafer and signals routed to another point. This is exemplified in FIG. 3e, wherein one such routing "channel" is schematically shown at 39, with an insulating enclosure indicated at 38.

Of course the principle of the method is equally applicable if there is only two layers in the structure, but also for four or even more layers.

Actuation of Deflectable Structures

In devices comprising deflectable structures, such as micro mirrors in projectors, fiber optical switches, optical amplifiers, loud speaker membranes etc., one of the desired features is to be able to control deflection and/or plane parallel movement of the structures. Below reference will be made to mirrors although the principles are applicable to any deflectable structure, such as fiber optical switches, optical amplifiers and loud speaker elements etc.

There are a number of different ways available to provide the desired controlled deflection. In the first place there has to be some kind of "hinge" or spring structure to which the mirrors are connected. One such structure is illustrated above in relation to FIG. 1, thus the mirror is attached to a support structure via a leg or arm that has a substantially smaller dimension in cross section so as to provide e.g. a torsional deflection. Other types of hinges such as bending or resilient elements (springs) can be used.

Figure 4A:
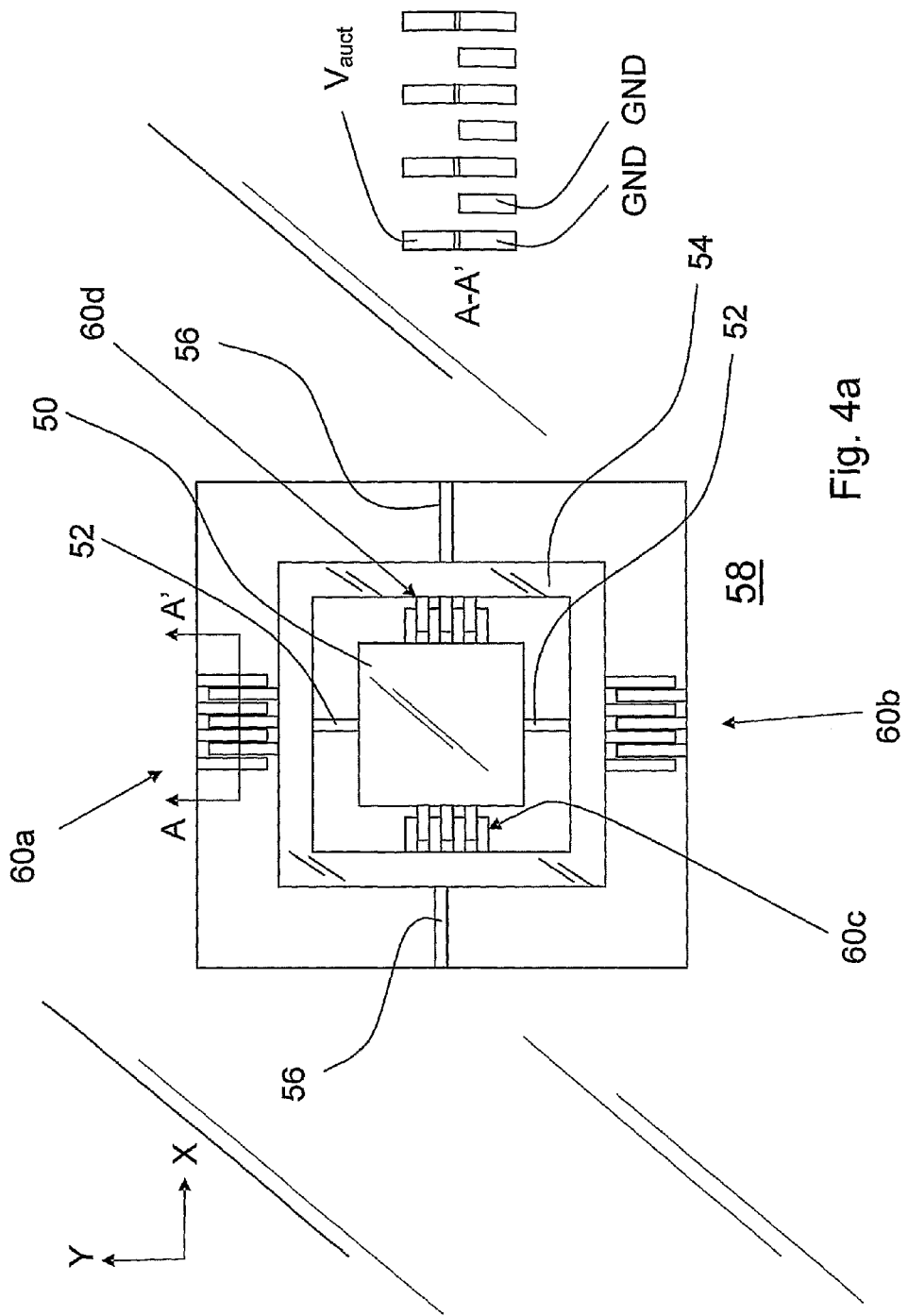
FIG. 4a shows one embodiment of a gimbal hinge with comb electrode actuation.

In order to extend the movements to movement in two dimensions (around two perpendicular axes) another type of hinge structure that can be used is a so called gimbal structure, see FIG. 4a. A gimbal is a pivoted support that allows the rotation of an object about a single axis. A set of two gimbals, one mounted on the other with pivot axes orthogonal, may be used to allow an object mounted on the innermost gimbal to remain vertical regardless of the motion of its support. In the present context a gimbal type structure is use to enable deflecting a mirror in basically all X-Y directions (i.e. 2D actuation) by suitable electrostatic actuation.

The electrostatic actuation can be achieved in a couple of ways.

The first to be mentioned is by using what can be referred to as "plate capacitor actuation", similar to FIG. 1b. Thus, for a mirror that is hinged to e.g. a torsional arm, there is provided one or more electrodes beneath the mirror at points such that when a potential is applied to the electrode there will be an electric field between the mirror and the electrode, causing an attraction towards the electrode whereby the mirror will deflect from its rest position towards the electrode. The mirrors can themselves act as electrodes or there can be provided electrode elements on the gimbals.

The actuation potential is applied to the electrodes by the provision of via structures extending through the substrate from the back side thereof. Thereby there will be no need for providing routing structures in the same plane as the electrodes, which has the disadvantage of occupying space, and may also be fairly complicated from a manufacturing point of view.

A disadvantage with the use of plate capacitor actuation is that it requires high voltages (hundreds of volts), and there is a risk for electrical break-through if the mirrors (or other elements) are large, thus requiring large deflection, i.e. requires large actuation gap.

Figure 4B:
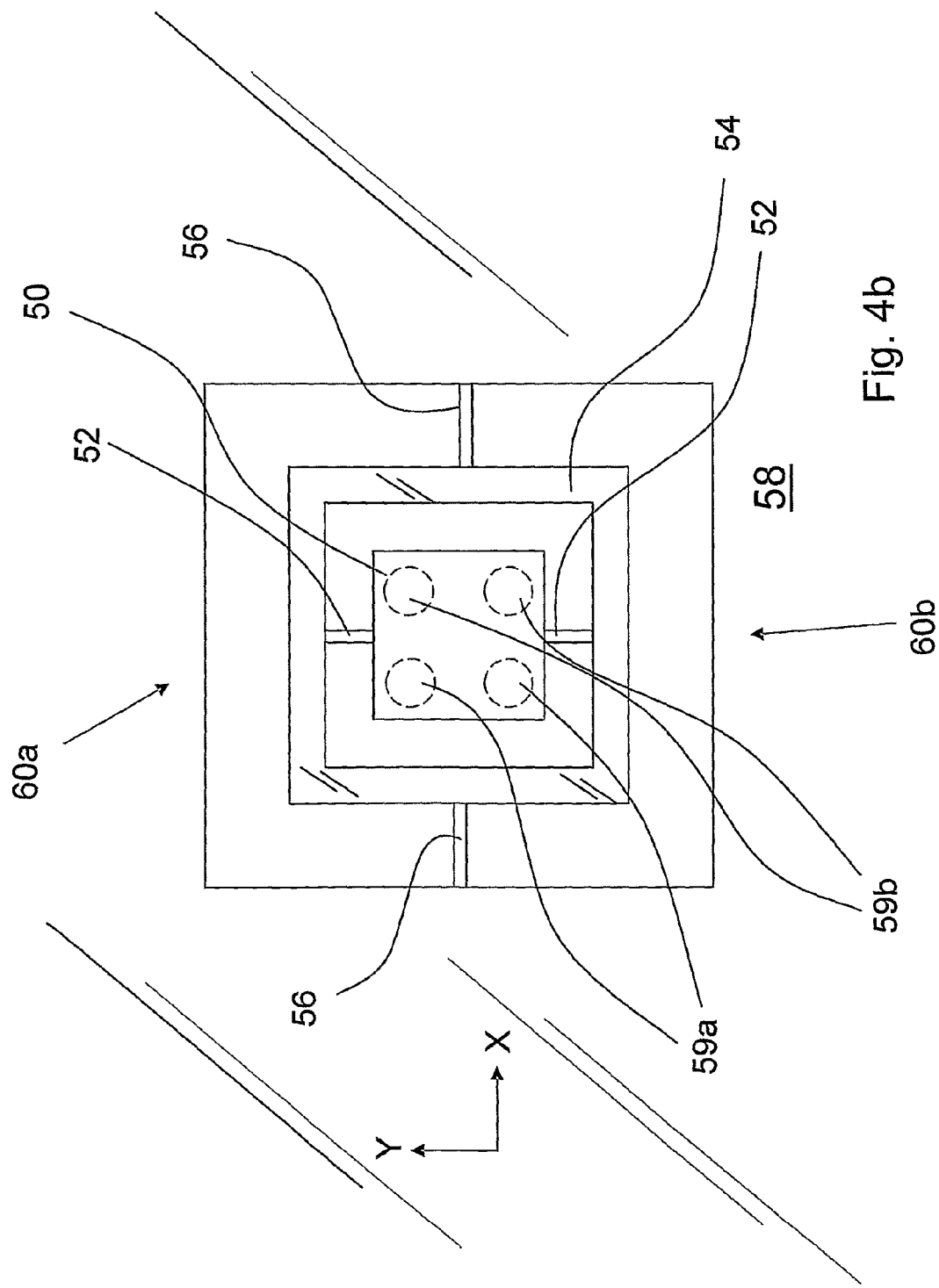
FIG. 4b shows one embodiment of a gimbal hinge with a combined comb electrode and plate electrode actuation.

The actuation can alternatively be provided by "comb electrode structures", which overcome the drawbacks of plate capacitor actuation. Examples of different designs of such comb electrodes are shown in FIGS. 4a-b, as applied to a deflectable micro mirror.

In FIG. 4a there is schematically illustrated a gimbal hinge structure comprising plate capacitor actuation.

Thus a mirror 50 is carried by torsion members 52 in a frame 54, which in turn is carried by torsion members 56 attached to a surrounding support structure 58, like in FIG. 4a.

However, instead of the comb electrodes 60c, 60d in FIG. 4a, beneath the mirror 50 there are shown in shadow lines two pairs of electrodes 59a and 59b, respectively. These electrodes are provided in or on the surface of the substrate 58 in the bottom of the cavity in which the mirror is suspended, by vias extending through the wafer and exposing an end surface, such that the end surface constitutes the electrode. Electrodes can alternatively be provided as electrode pads applied on the end surface of the vias.

When electrodes 59a are energized they will cause a deflection of the mirror in a direction inwards (at the left portion as seen in the figure) with respect to the plane of the drawing, i.e. a tilting about the Y-axis. Correspondingly energizing of electrodes 59b will cause a deflection inwards at the right portion, i.e. again a tilting about the Y-axis but in the opposite direction. Obviously the opposite part will be deflected outwards.

Deflection in the other perpendicular directions is provided by energizing one electrode from each pair, i.e. 59a and 59b, respectively. Thus, when this combination of actuation electrodes are energized the gimbal frame 54 will deflect around its torsion hinges 56, and cause the mirror to deflect correspondingly.

With in-plane comb drive actuators, large action areas over small gaps could be obtained while still offering the possibility for large movements/deflections. Large areas and small gaps also means low action voltage.

Thus, in FIG. 4b there is schematically illustrated a gimbal hinge structure comprising dual comb electrode actuation.

Thus a mirror 50 is carried by torsion members 52 in a gimbal frame 54, which in turn is carried by torsion members 56 attached to a surrounding support structure 58. As an alternative spring members can be used for carrying the mirror.

As can be seen in FIG. 4b there are also provided mating comb structures 60a, 60b on the frame 54 and on the support 58, respectively, for tilting the mirror about the X-axis, and comb structures 60c, 60d provided on the mirror 50 and on the frame 54, respectively, for tilting about the Y-axis. In this way the mirror can be actuated to move freely in two dimensions, only restricted by the space available in the cavity in which it is suspended. The comb electrodes on the support (actuation electrodes) are connected to via structures beneath the structure and extending through the support from the back side, like in the example discussed above. The combs on the gimbal frame 54 are made from two of the layers in the structure with an insulating layer between, whereas the combs on the mirror are made from one layer, namely the same as the mirror i.e. the lower layer of the two. The gimbal combs are energized at an actuation voltage $V_{auct}$ in the upper portion and connected to ground potential GND at the lower, and the mirror combs are grounded. The combs are connected to via structures in a suitable layer in the wafer by routing within the torsion bars 52, 56 and in the frame 54, in accordance with the invention. This can be seen in FIG. 7 where in the shown embodiment the lower part 72 of the comb structure 70 is coupled to a via 74 through the second layer 76 from the top in FIG. 7 and the "plug" 78. Thus, as shown, these combs are provided at different levels in the structure, i.e. they are made in different device layers of the SOI wafers used for the manufacture.

Thus, when a potential is applied to the actuation electrodes, the comb structure on the mirror will be pulled downwards, but in view of the "fingers" of the combs mating in an interleaved fashion, the deflection can be provided in a more versatile manner than in the case where electrodes are provided beneath the mirror. For example it will be possible to make more compact structures using the comb electrodes.

In a further embodiment the hinges are "hidden" beneath the mirrors, which has the advantage that the mirrors can be very densely spaced, i.e. a very compact design can be obtained. This is required for e.g. some optical applications such as adaptive optics whereas much as possible of the device should be covered by movable mirrors, i.e. there should be a minimum area of "dead" surface without mirrors.

Figure 5:
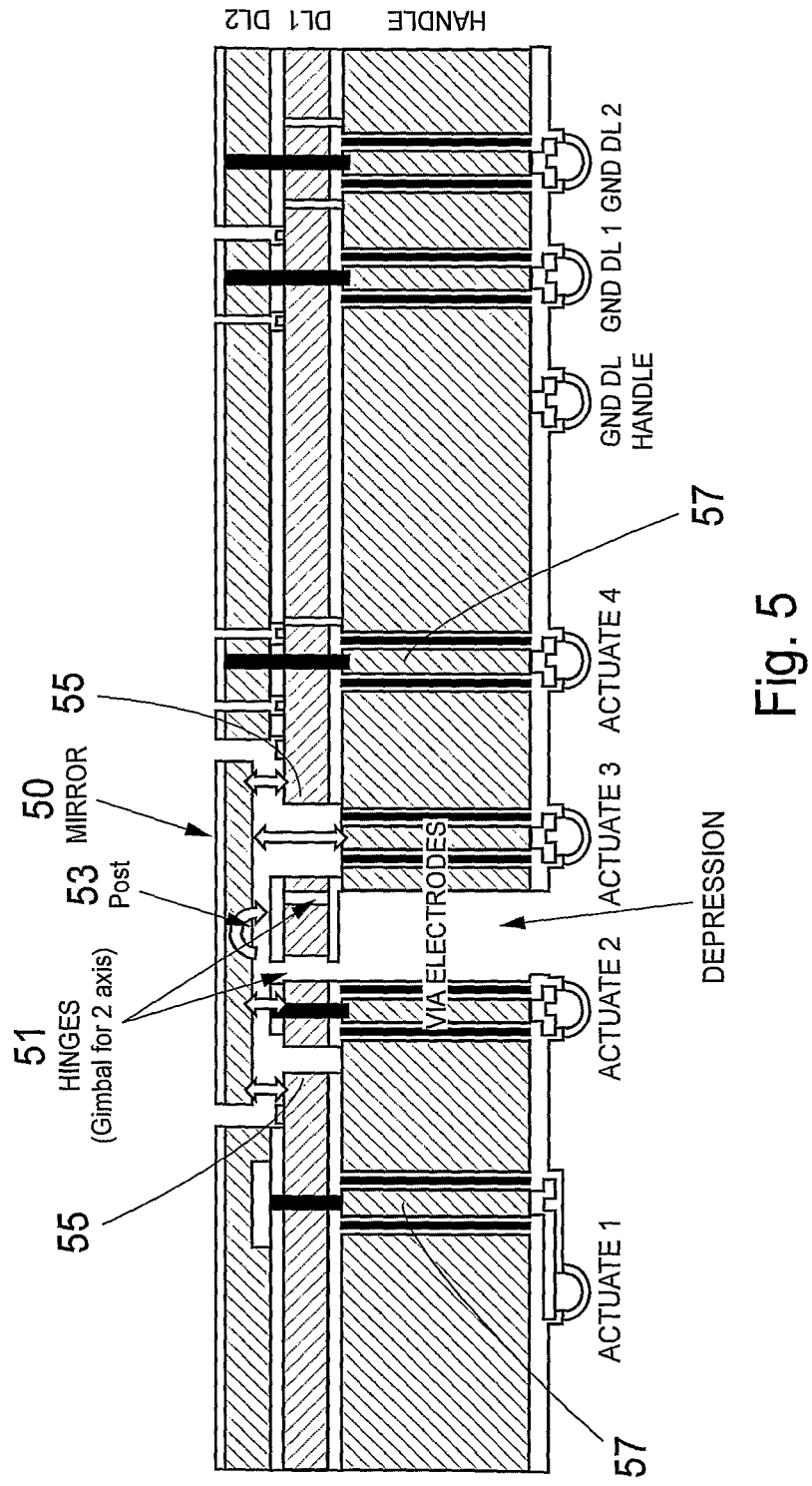
FIG. 5 shows an embodiment with actuation using of hidden hinges.
Figure 6:
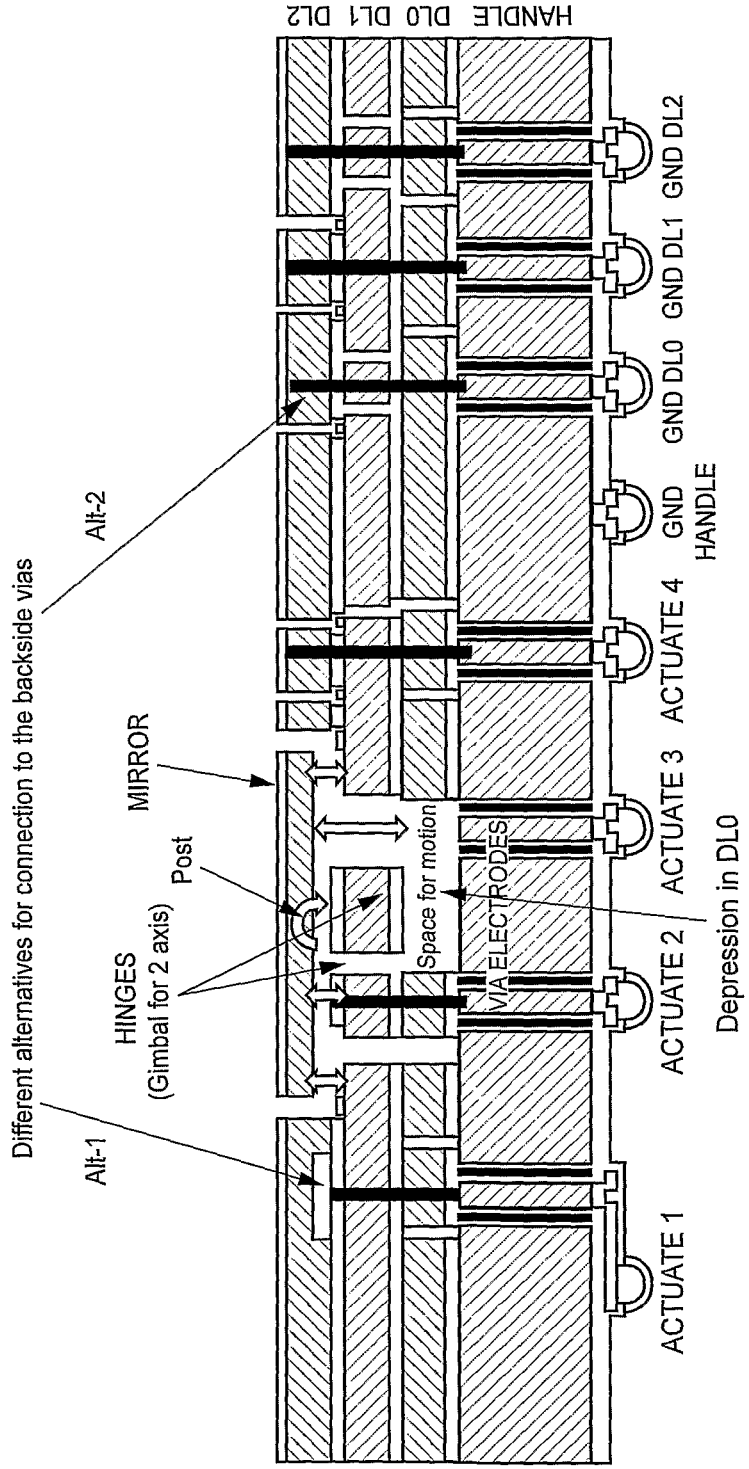
FIG. 6 shows another embodiment with actuation using of hidden hinges.

Also, for certain wave lengths of light the mirrors often need to be coated with a suitable material. Such reflective coating is mostly required to be present only on the mirror surface itself, and not on the hinges and/or gimbal structures. With the hidden hinge concept the entire wafer can be coated. If hinges are not hidden, there has to be selective coating of the reflective material, e.g. by using "lift-off", shadow mask stencile shadow mask and other techniques which is much more complicated, and does not provide as good yield. Hidden hinges are shown in FIGS. 5 and 6 where a gimbal structure 51 is provided for enabling movement about two axes. Here the mirror 50 is provided on a post 54.

Actuation electrodes 55 are provided by routing in the second layer from vias 57. It is of course also possible to provide hidden hinges for movement about a single axis.

To make such hidden hinges the process sequence will be different from the above described. Reference is made to FIG. 5.

The same basic process involving two SOI wafers can be used, but the hinges are made in the device layer DL1 of the first SOI wafer, and the mirror and a post carrying the mirror is made in the device layer DL2 of the second SOI wafer. When the SOI wafers have been bonded together after the required structures have been made in the respective wafer, a backside defined opening (DEPRESSION in FIG. 5) is made from the back side in the handle layer (HANDLE in FIG. 5) of the first SOI wafer to provide a free space in which the hinges can move during deflection.

Alternatively a further SOI wafer is bonded to the structure, this is shown in FIG. 6. Thereby the device layer (DL1 in FIG. 6) thereof is used to provide a spacer member to enable the mirror to be moved (deflected) as desired. The device layer DL0 is in this case etched to provide a depression which when the wafer is bonded provides the space for motion, as indicated in FIG. 6.

The above described processes are applicable also to the provision of low voltage comb electrode actuators, arranged in dual-axis mirror designs containing gimbal structures, although they are not hidden structures.

Figure 7:
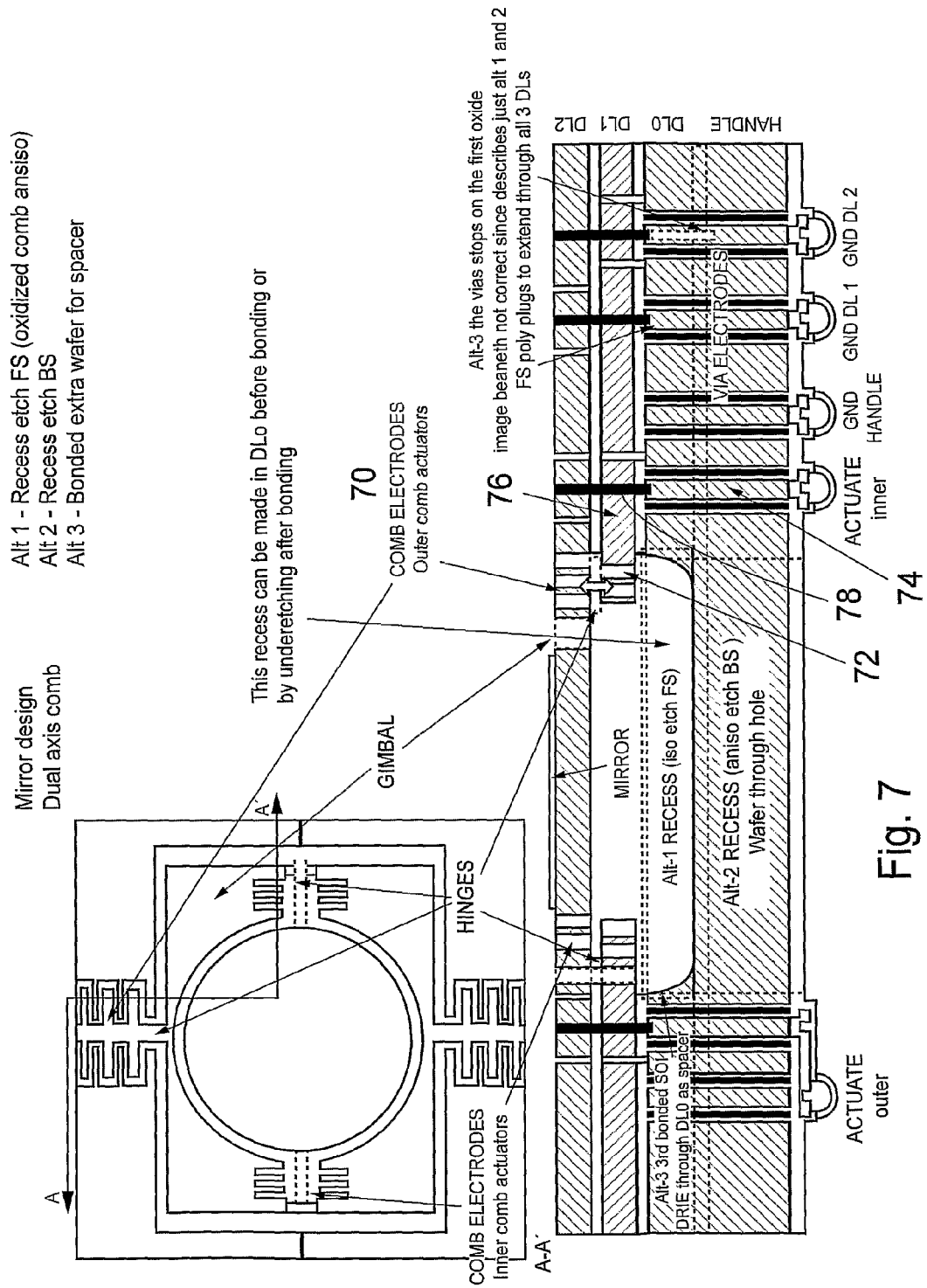
FIG. 7 shows a gimbal hinge structure and actuation means

For comb electrodes also a further method is available, see FIG. 7. In order to achieve this one has to perform an underetch under the hinge structures after the wafers have been bonded together. Thereby the hinge structure is protected by an oxide layer and a silicon etch is applied whereby material is removed also from under the hinge so as to provide a free space (Alt-1 RECESS) for deflection. The handle of this further wafer is removed by etching when the other wafer(s) have been bonded.

It is also possible to provide a larger recess (Alt-2 RECESS) under the mirror by removing additional material from the handle layer below the device layer DL0.

Also, it is possible to provide the recess (Alt-3 RECESS) by a Deep Reactive Ion Etch (DRIE) through the DL0 layer.

Figure 8:
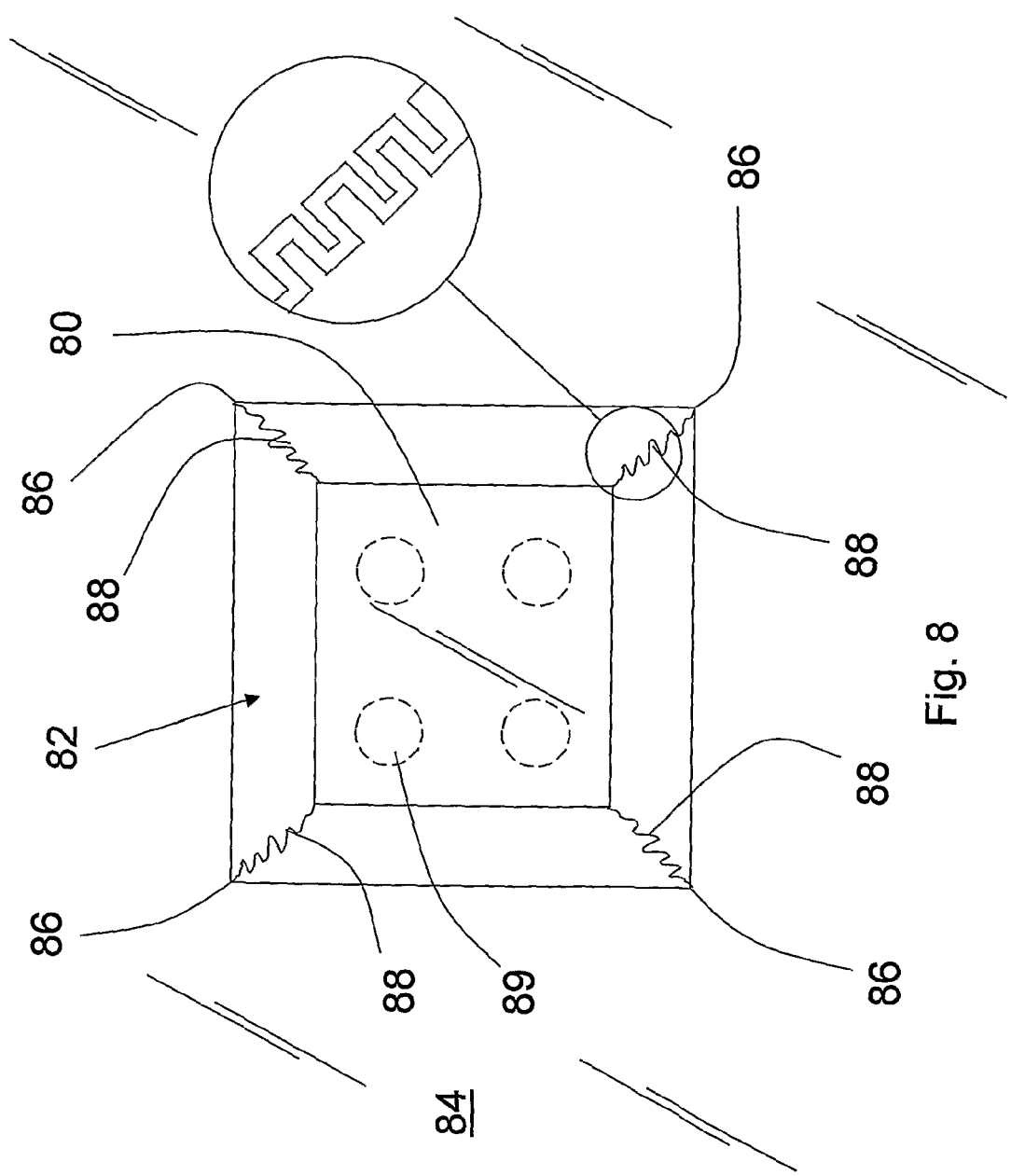
FIG. 8 is an embodiment for optical switching.

In a particular application, schematically shown in FIG. 8 a movable element such as a mirror 80 is provided above a cavity 82 in a substrate 84. In the shown embodiment the mirror 80 is suspended at its corners 86 to the substrate by means of spring members 88. The spring members 88 are only schematically represented in FIG. 8 at 88. However, in on embodiment they can be "meander" shaped as shown in the maginified insert in FIG. 8. However, any shape that would provide some spring action or resilience would be usable.

Four electrodes 89 are provided beneath the movable element 88, but one single electrode may be sufficient. Now, if the electrodes are energized the movable element will be electrostatically attracted by the electrodes and thereby translated inwards in the cavity, i.e. a plane parallel displacement will occur. This application can be used as an optical amplifier, phase changer or other adaptive switch.

It is not strictly necessary to provide four electrodes, any number from one and more could be used, as long as the attractive force can be applied evenly such that the actual plane parallel translation displacement is ascertained. For example one large electrode having a surface area corresponding to at least a part, preferably a major part, of the surface of the movable element would function. The electrodes can either be formed by the exposed surface of the via in the bottom of the cavity in which the mirror is suspended, or they could be provided as metal pads on the vias.

In the description given above the electrodes have only been used for actuation purposes. However, in a further embodiment shown in FIG. 9, a piezo electric film 90 (made from e.g. PZT, ALN, piezo electric polymers and other materials known to the skilled man) is deposited on a schematically shown movable element 92 (e.g. a membrane) which is suspended above a cavity 94. The piezo film has one electrode 91, 93 attached to each side. The electrodes are connected to vias 95, 96, respectively, using a layered structure in accordance with the present invention.

The reverse effect of the piezo material can be used for picking up signals/energy from the movable structure. In this mode it can be used for sensors or for energy harvesting applications. Similar to a comb drive structure, which can also be used in a sensing mode, at least two separate routing layers according to the present invention are needed.

Now methods of making the structures disclosed above will be described. The description will be given with reference to mirrors and mirror arrays. However, the principles used are equally applicable for other movable and deflectable elements such as those mentioned earlier, namely are oscillators, vibrating membranes for loud-speakers, optical switches etc.

Method of Making Micro-Mirrors

In a process for manufacturing deflectable micro mirrors and/or arrays of such mirrors, at one stage in such a process and before the actual mirror structures are manufactured, two wafers (a first wafer and a second wafer) are bonded together in a controlled atmosphere, e.g. vacuum. One of the wafers (first wafer) thereby has a depression formed in it to provide the necessary space in the final structure for the deflectable mirrors to move freely during deflection. The second wafer (suitably a SOI wafer) provides a "lid" over the depression.

Thus, after bonding together of the wafers the depression in the first wafer will be sealed off by the second wafer and thus a controlled atmosphere (e.g. vacuum) cavity is formed. In subsequent steps of the process, machining of the second wafer is performed for making the final mirror structures. The mirror structures comprise an actual mirror part which is relatively thick and rigid, and a hinge part.

However, the mirror can have different thicknesses, for providing different resonance frequencies—thick mirrors mean large mass and low frequency; thin mirrors mean small mass and high frequency. The frequency requirements may be contrary to the flatness requirements. Thinner mirrors can more easily be bent due to mechanical impact. It is possible to make a mirror with a rigid frame part and remaining areas thinned down to provide low mass and higher rigidity. Also the hinges can be thinned down to varying degrees.

The hinge will be substantially thinner than the mirror in some embodiments, in order to provide the required flexibility for the hinge to function as desired. In particular the hinge can be provided as so called gimbal structures.

However in other cases, e.g. when a torsional effect is desired, the hinge can have the same thickness as the mirror, but will then have a lateral extension (i.e. in the transverse direction of the hinge) that is relatively small.

Manufacturing of these structures are made by suitable masking and etching of the second wafer. However, the process steps of making the mirror structures are performed in an atmosphere having a different pressure (normally higher) than the pressure prevailing inside the cavity. Thus, since there will be a pressure difference across the "lid", when the etching process "breaks through" the SOI wafer to provide the free-hanging hinged mirrors, there will be a sudden pressure levelling. This pressure levelling yields strong forces such that the delicate hinge structures mirrors for the mirrors very easily breaks and the mirrors fall out from the device, with extremely low yields as a result.

According to the present invention there is provided for a controlled venting of the structure such that the pressure levelling will be very smooth and no strong forces will be exerted on the delicate hinges.

The solution according to one embodiment of the invention is schematically illustrated in FIGS. 2*a*-*d*.

Figure 2:
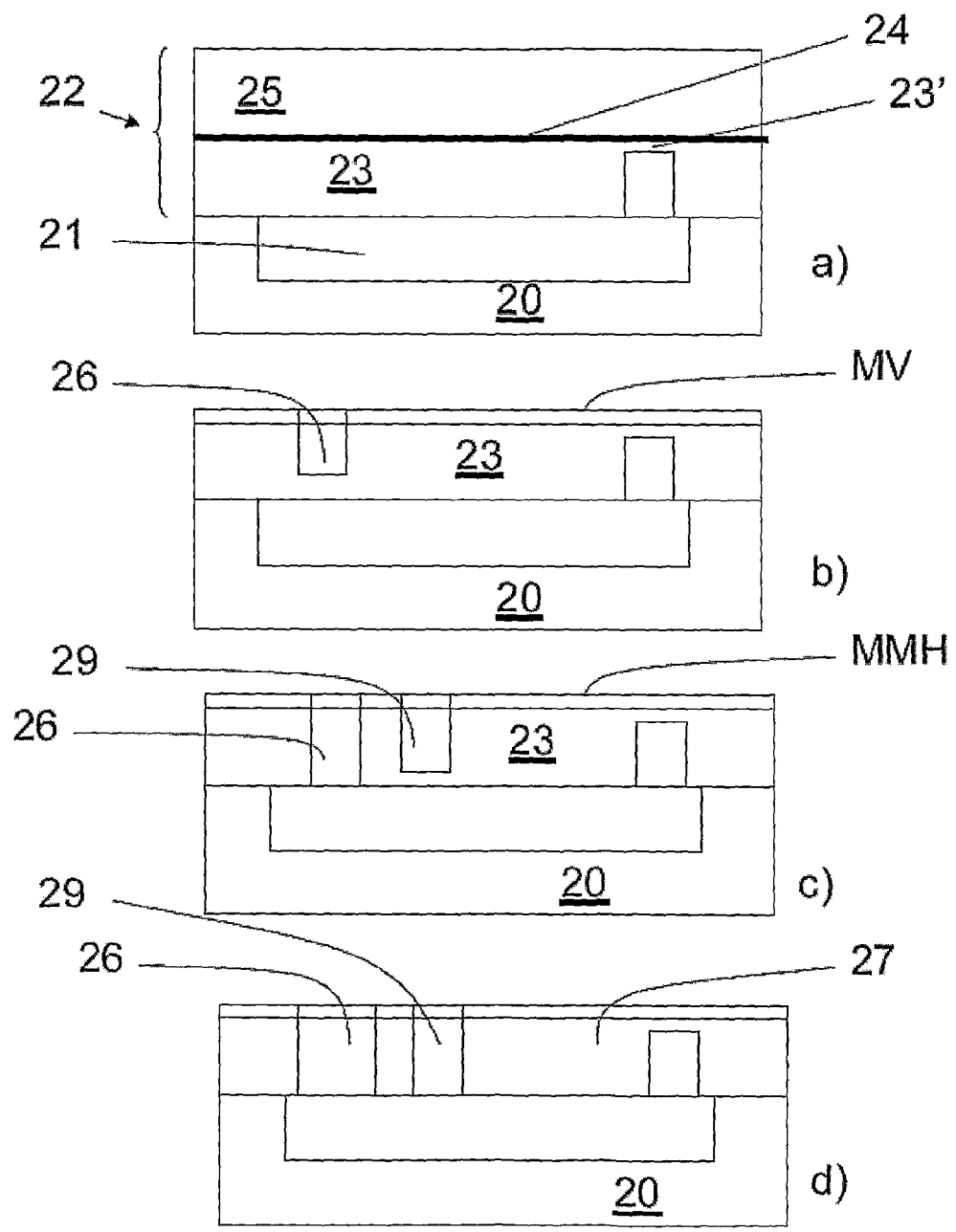
FIGS. 2a-d illustrate a sequence for venting during manufacture.

FIG. 2*a* shows a first wafer 20 (substrate wafer) having a depression 21 formed therein, bonded to a SOI wafer 22 comprising a device layer 23, an oxide layer 24 and a handle layer 25. In the device layer 23 of the second wafer suitably a thinned down portion 23' has been made to define the thickness of a hinge that is to connect the mirror with the supporting structures in the finished product.

The handle layer 25 is removed (FIG. 2*b*) and after suitable masking MV a first etching is performed to provide a vent hole precursor structure 26 in the remaining device layer 23. This precursor structure is essentially a hole or a groove, which has a predefined depth, i.e. which extends down into the device layer.

Then there is provided suitable masking MMH (FIG. 2*c*) to define the mirror 27 and its hinge 28 structures by opening up a contour (at 29) in the mask, and a second etch is performed. This is schematically illustrated in FIG. 2*c*. Thereby the vent hole precursor structure 26 will open up the cavity 21 with controlled atmosphere (e.g. vacuum) before the etch has removed so much material in the contour trench 29 from the device layer that the material in the trench at 29 has become so thin that it might break due to the forces exerted when pressure is leveled out through the vent hole.

The etch is continued until the mirror 27 is free-etched, i.e. the device layer is etched through in the contour trench at 29.

In an alternative embodiment the entire process can be performed in one step. This is possible by dimensioning the vent hole precursor structure 26 to be large enough that the etch will excavate material therein at a faster rate than in the trench defining the mirror which in its turn will be etched faster that the hinges, like in the previous embodiment. This is schematically shown in FIG. 2*d*, which shows a larger vent hole 26 than in FIG. 2*c*.

In particular, the invention provides a method of making a layered MEMS structure comprising alternating conductive and insulating layers and an electrical feed-through structure for routing electrical signals or potentials to selected points or areas within a selected layer in said structure, the method comprising the steps of: providing a first SOI wafer having a via structure provided in the handle layer and extending therethrough to the insulating buried oxide layer; providing a second wafer; bonding the wafers together; thinning the second wafer; creating an insulating structure in the form of a trench running in a closed loop, in the device layer of either of the two wafers, the material inside the closed loop at least partially overlapping the via structure when the wafers are bonded together; making a hole through the device layers of the bonded wafers, said hole extending down into the via structure and filling said hole with conductive material, suitably poly silicon, to provide electrical connection.

Also there is provided a method of making a device having a movable micro element provided above a cavity in said device, comprising at least one movable element and at least one hinge for said element and actuation electrodes for causing movement of said micro element said electrodes being connected to routing structures made by the method as claimed in claim 20 or 21, the method comprising the steps of: bonding together a first wafer, having a depression formed therein for providing enough space for a micro element to be able to deflect from a rest position as desired without contacting surrounding structures, and a second wafer from which the micro element subsequently is to be made, whereby a closed cavity is formed between the wafers; providing mask structures to define i) the micro element, and ii) the hinge structure, etching through said mask structures in a controlled way such that the vent hole opens up before the micro element and hinges have been finished.

Furthermore, there is provided a method of making a MEMS structure comprising alternating conductive and insulating layers and an electrical feed-through structure for routing electrical signals or potentials to selected points or areas within a selected layer in said structure, the method comprising the steps of: providing a first SOI wafer having a via structure provided in the handle layer and extending therethrough to the insulating buried oxide layer; providing a second wafer; bonding the wafers together; thinning the second wafer; creating an insulating structure in the form of a trench running in a closed loop in the device layer of either of the two wafers, the material inside the closed loop at least partially overlapping the via structure when the wafers are bonded together; making a hole through the device layers of the bonded wafers, said hole extending down into the via structure and filling said hole with conductive material, suitably poly silicon, to provide electrical connection.

Finally there is also provided a layered MEMS structure comprising alternating conductive and insulating layers, and further comprising: a via structure in a first outer layer; a conductive plug, preferably of poly silicon extending through the other layers and into the via structure to provide conductivity through the layers; and an insulating enclosure surrounding said conductive plug in at least one selected layer of said other layers so as to insulate the plug from the bulk said selected layer.

What is claimed is:

1. A layered micro-electronic and/or micro-mechanic structure, comprising at least three alternating electrically conductive layers with insulating layers between the conductive layers, and further comprising:
   a via in a first outer layer, said via comprising an insulated conductive connection made of wafer native material through the layer;
   an electrically conductive plug extending through the other layers and into said via in the first outer layer in order to provide conductivity through the layers; and
   an insulating enclosure surrounding said conductive plug in at least one selected layer of said other layers for insulating said plug from the material in said selected layer; wherein said plug is uninsulated from surrounding material in at least one of the other layers.

2. Structure as claimed in 1, wherein the conductive plug is of poly silicon, doped silicon, silicide or metal.

3. Structure as claimed in 1, wherein an insulating enclosure comprises insulating trenches forming routing channels within a layer such that the via is localized at a point on the wafer, thereby forming a routing structure for routing signals laterally within the layer.

4. Structure as claimed in 1, wherein there are three conductive layers and the insulating enclosure is provided in one of the layers.

5. Structure as claimed in 1, wherein there are four conductive layers and the insulating enclosure is provided in two of the layers.

6. Structure as claimed in 1, wherein a cavity is formed in one or more of the layers.

7. Structure as claimed in 6, wherein said cavity is formed in the bottom layer.

* * * * *